United States Patent [19]

Hagan

[11] Patent Number: 4,799,993

[45] Date of Patent: Jan. 24, 1989

[54] ROTARY DEVELOPER AND METHOD FOR ITS USE

[75] Inventor: Edward F. Hagan, Raleigh, N.C.

[73] Assignee: E. I. Du Pont de Nemours and Company, Wilmington, Del.

[21] Appl. No.: 192,474

[22] Filed: May 10, 1988

[51] Int. Cl.$^4$ .......................... B44C 1/22; B29C 37/00
[52] U.S. Cl. ..................................... 156/644; 134/137; 134/198; 134/33; 156/640; 156/655; 156/668; 156/345
[58] Field of Search ............... 156/640, 641, 644, 646, 156/655, 659.1, 668, 345; 134/33, 37, 137, 183, 198, 172; 430/434; 354/297, 300, 354

[56] References Cited

U.S. PATENT DOCUMENTS

| | | | |
|---|---|---|---|
| 3,072,133 | 1/1963 | Martz | 134/183 |
| 3,348,557 | 7/1965 | Adamson | 134/113 |
| 3,772,104 | 11/1973 | Chandross et al. | 156/18 |
| 3,888,674 | 6/1975 | Nygaard | 96/36 |
| 3,953,265 | 4/1976 | Hood | 156/8 |
| 4,300,581 | 11/1981 | Thompson | 134/57 |
| 4,541,141 | 9/1985 | le Goff | 15/302 |

Primary Examiner—William A. Powell
Attorney, Agent, or Firm—John E. Griffiths

[57] ABSTRACT

A rotary developer for removing unhardened portions of a layer of an electronic part to form vias in the part. The developer orbits the layer about the axis in one direction while rotating the layer in an opposite direction eliminating leading and trailing edge effects on vias.

36 Claims, 10 Drawing Sheets

ONE LANE MISSING

ROTARY DEVELOPER AND METHOD FOR ITS USE

BACKGROUND OF THE INVENTION

1. Field of the Invention

This invention relates to a rotary developer used in the formation of vias in dielectric layers made of photohardenable polymer for hybrid microelectronic parts and, more particularly, to a developer that provides uniform development of part layers and vias.

2. Description of the Prior Art

Photohardenable polymers used in the formation of dielectric layers for hybrid microelectronic parts have traditionally been difficult to develop. These electronic parts can comprise a ceramic substrate with a layer of a conductive material, such as copper, on one side of the substrate and a photohardenable layer on the conductive material. The photohardenable layer comprises a layer of photohardenable polymer, which may be a photosensitive composition which upon exposure to actinic radiation forms crosslinks or polymers of higher molecular weight changing the rheological character of the compositions. Preferably the layer is a thermoplastic layer. The photohardenable layer is exposed to actinic radiation through radiation transmissive areas of a radiation blocking mask. The radiation blocking areas of the mask leave unhardened portions in the shape of vias extending from a front surface of the layer to the conductive material. The polymer layer is developed by removing or washing away the unhardened portions with an appropriate liquid to form the vias. When the photohardenable polymer is Fodel ®, the liquid can be a solvent, such as 1,1,1-trichloroethane and unexposed portions are dissolved in the liquid and washed away. The layer including its walls defining the vias are then dried. The vias can be filled with conductive material, such as copper or gold to provide a conductive path between the layer of conductive material and an integrated circuit (IC) chip to be mounted on the dielectric layer.

U.S. Pat. No. 3,772,104 discloses a prior art spinning developer. The developer comprises a disk rotated by a motor. The electronic part is attached to the disk. An etching solution is sprayed at the part while the part is spinning with the rotor. The soluble portion of the photoresist is removed as a result of the impact(s) of the solution on the photoresist and the gravity and centrifugal force acting on the solution containing the dissolved or removed photoresist on the spinning part.

A spinning developer, like the one just described, has been used to remove unexposed photopolymer portions of a layer on an electronic part. In this developer, the nozzle spraying the solution at the part is located generally on a line perpendicular to the part with the line spaced from the part axis of rotation. See FIG. 1 which illustrates such a part 10 rotating in the counterclockwise direction as indicated by the arrow A. The nozzle is centered on a line intersecting and directed toward point P. The nozzle is a conventional fan spray nozzle which sprays an atomizing mist generally in a continuous planar fanning out pattern along the line L.

The above described developers have low productivity because only one part can be processed on each machine at a time. Required high spin rates, typically around 3,000 revolutions per minute (rpm), also limit use of these developers to parts which are symmetrical about a spin axis to avoid high forces during spinning which might cause the part to fly off the machine. A further limitation is the problem of uniformly developing parts, especially large parts, because of the different spray treatment received by a part from the spin axis out to the periphery of the part.

It is an object of this invention to provide a rotary developer that processes more than one electronic part at a time.

It is another object of this invention to provide a rotary developer that uniformly develops parts including large parts and nonsymetrical parts.

SUMMARY OF THE INVENTION

In accordance with the present invention, a rotary developer is provided for removing a portion of a layer of an electronic part to form a via in the part, the developer including:
 a support;
 a rotor having a rotor axis, the rotor rotatably connected to the support about the rotor axis;
 a part holder having a holder axis, the holder rotatably connected to the rotor about the holder axis;
 means for rotating the rotor about the rotor axis in a first direction and for rotating the holder about the holder axis in a second direction; and
 means for spraying a liquid and a gas on the layer to remove the portion to form the via and to dry the layer and the via.

The invention further comprises a method for developing a portion of a layer comprising hardened and unhardened portions of an electronic part to form a via in the layer comprising the steps of:
 loading the electronic part on a part holder rotatably mounted on a rotor;
 spinning the rotor about an axis in a first direction;
 orbiting the holder about the rotor axis;
 rotating the holder about a holder axis;
 spraying a liquid on the layer to wash out the unhardened portion to form a via;
 drying the layer and the via; and
 removing the part.

BRIEF DESCRIPTION OF THE DRAWINGS

The invention will be more fully understood from the following detailed description thereof taken in connection with the accompanying drawings, which form a part of this application and in which.

DESCRIPTION OF THE PREFERRED EMBODIMENTS

Figure 1:
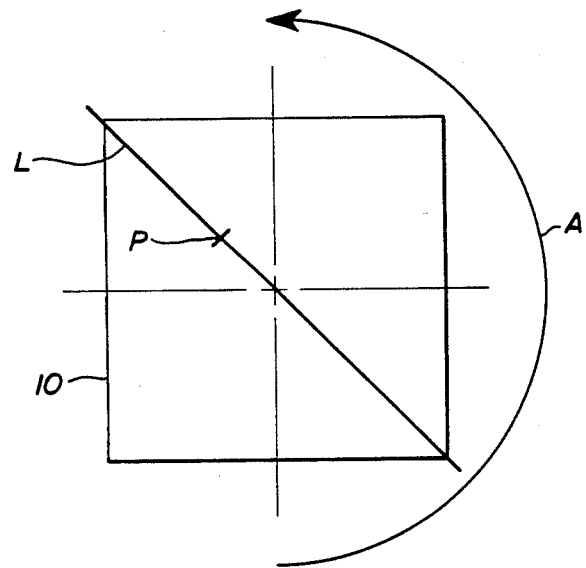
FIG. 1 is a schematic illustration of a prior art spinning developer.

Throughout the following detailed description, similar reference numerals refer to similar elements in all figures of the drawings.

As explained above, FIG. 1 illustrates a prior art spinning developer having certain disadvantages. The above described disadvantages are known, but the causes of these disadvantages have not heretofore been realized. An understanding of these causes helps understand the present invention.

Figure 2:
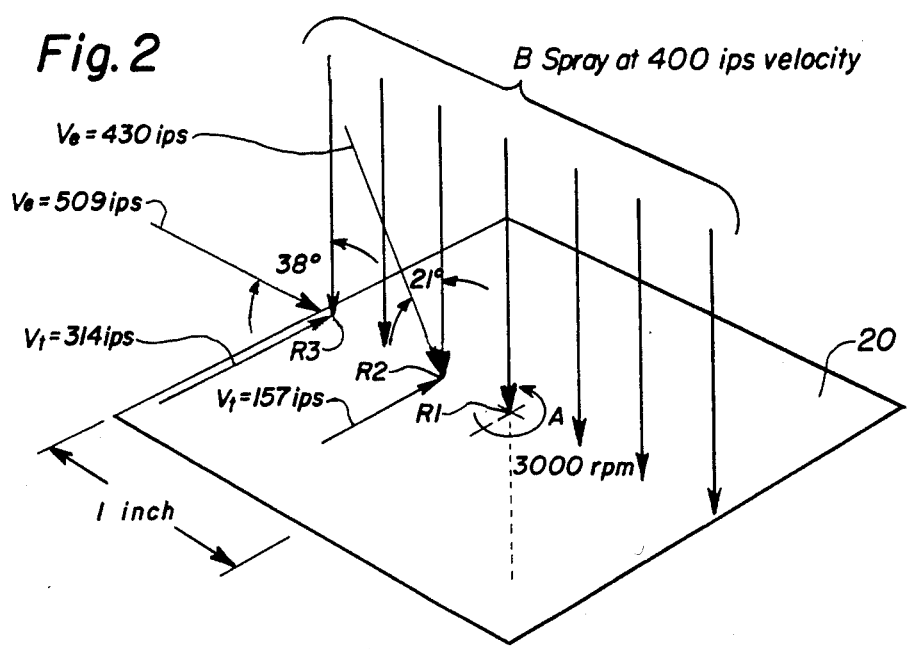
FIG. 2 illustrates the angle and velocity spray effectively impacts a part layer in relation to distance from part axis of rotation.

FIG. 2 shows that the velocity of the spray impacting the layer from a developer like the one illustrated in FIG. 1 is related to the radial distance from the part axis of rotation.

Referring to FIG. 2 for illustration purposes, there is a layer 20 rotating counterclockwise about an axis of rotation at 3,000 revolutions per minute (rpm) in the direction of arrow A. The axis of rotation is perpendicular to the layer and passes through point R1. Spray is directed vertically down and perpendicular to the layer as explained in relation to FIG. 1 and as illustrated in FIG. 2 by vector arrows B at a uniform velocity, Vb, of 400 inches per second (ips). The instantaneous horizontal velocities component, Vh, of the spray with respect to points on the layer 20 at R1 on the layer axis of rotation, at R2 which is one half of an inch radially from the layer axis of rotation and at R3 which is one inch radially from the layer axis of rotation are calculated as follows:

$Vh$ at $R1$ = angular velocity (rpm) × circumference (inches per second)/(seconds per minute)
= $2\pi rN/60$
= 0
$Vh$ at $R2$ = $(2\pi)(.5)(3000)(60)$
= 157 ips
$Vh$ at $R3$ = $(2\pi)(1)(3000)(60)$
= 314 ips The vector sum of these instantaneous velocities, $Vh$, with the velocity, $Vb$, of the spray results in the effective velocity ($Ve$) of the spray at points R1, R2 and R3 to be:

$Ve$ at R1=400 ips directed 0° from the layer axis of rotation and toward the layer.

$Ve$ at R2=430 ips directed 21° from a line perpendicular to the layer and toward the layer.

$Ve$ at R3=509 ips directed 38° from a line perpendicular to the layer and toward the layer.

Thus, farther from the layer axis of rotation results in greater effective velocities of spray impacting the layer and greater impact angles with respect to lines perpendicular to the layer.

Figure 3:
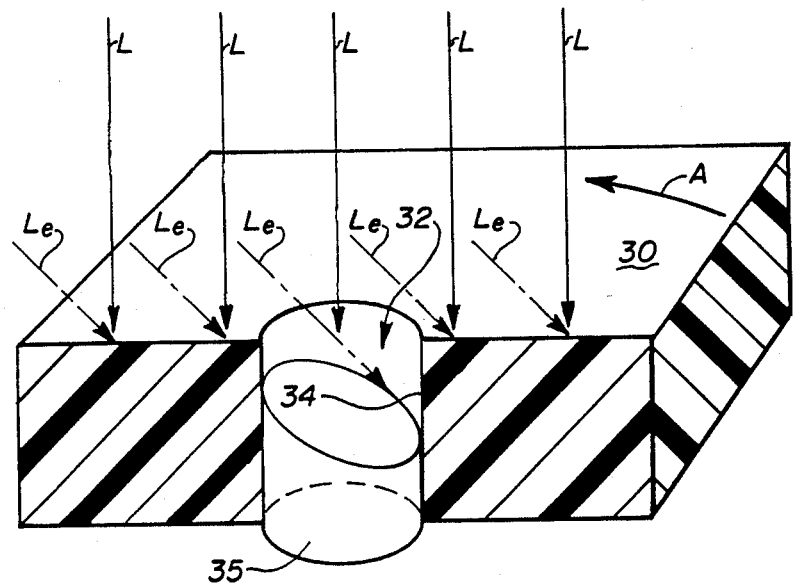
FIG. 3 illustrates spray impacting a layer forming a via.

Referring to FIG. 3, there is illustrated a sectional perspective view of a via 32 being formed which is spaced from a layer axis of rotation. Liquid L is being sprayed perpendicular to the layer as indicated by the arrows L. However, due to the rotation of the layer 30 in the direction of arrow A about the layer's axis of rotation, the effective direction of the liquid is indicated by the arrows Le. The liquid first causes some of the unhardened portion of the layer 30 to be washed away or removed partly forming the via 32. As you can see more of the unhardened portion is removed from a trailing side 34 of the via 32, than the leading side. The deeper the via 32 and the farther from the layer axis of rotation, the more likely that a remaining portion 35 will be left blocking the via 32.

Figure 4:
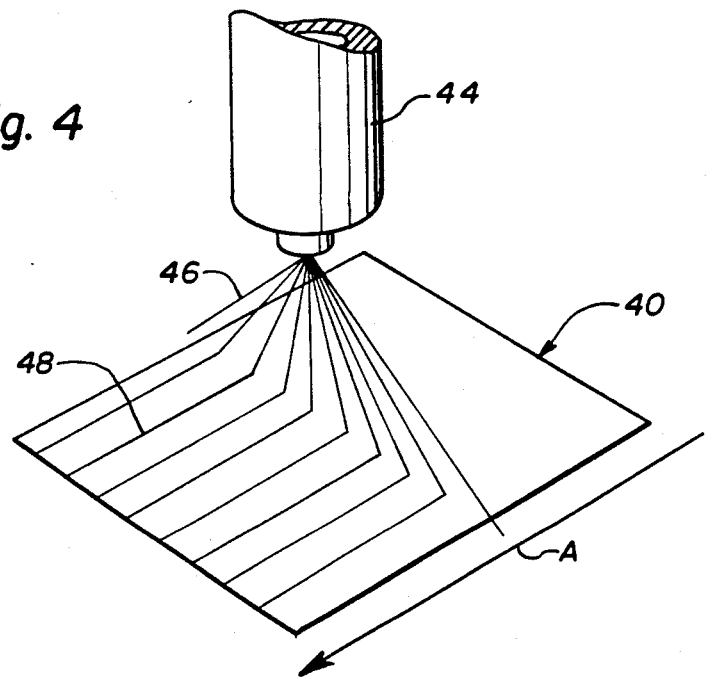
FIG. 4 illustrates the use of a simplified fan spray nozzle spraying discrete lines of liquid toward a layer developing discrete lanes on the layer.
Figure 5:
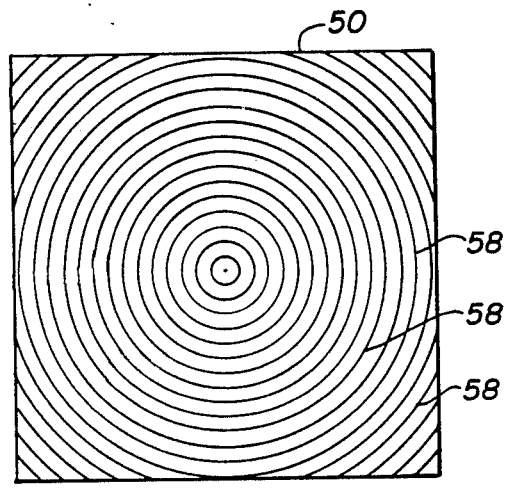
FIG. 5 shows lanes that would be formed using the nozzle illustrated in FIG. 4 for the nozzle in FIG. 1.
Figure 6:
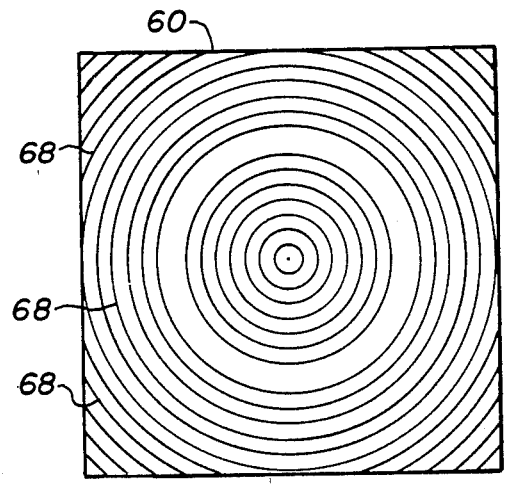
FIG. 6 shows lanes that would be formed using the nozzle illustrated in FIG. 4 for the nozzle in FIG. 1 when one of the spraying lines is non-operational.

Another problem with the FIG. 1 developer is illustrated in FIGS. 4–6.

FIG. 4 shows a simplified fan nozzle 44 that sprays discrete lines 46 of liquid toward a layer 40. The layer 40 is moving in the direction of arrow A. The liquid lines 46 develop the layer 40 only along lanes 48. FIG. 5 illustrates the pattern of lanes 58 developed on a layer 50 using the nozzle described in relation to FIG. 4 as the nozzle used in the developer illustrated with respect to FIG. 1. FIG. 6 illustrates the pattern of FIG. 5 with one of the nozzle lines inoperative. One of the lanes 68 is missing. The layer 60 surface area that would have been developed by this defective line simply is not developed. Further, the undeveloped area extends entirely around the layer axis of rotation in a ring shape.

Figure 7:
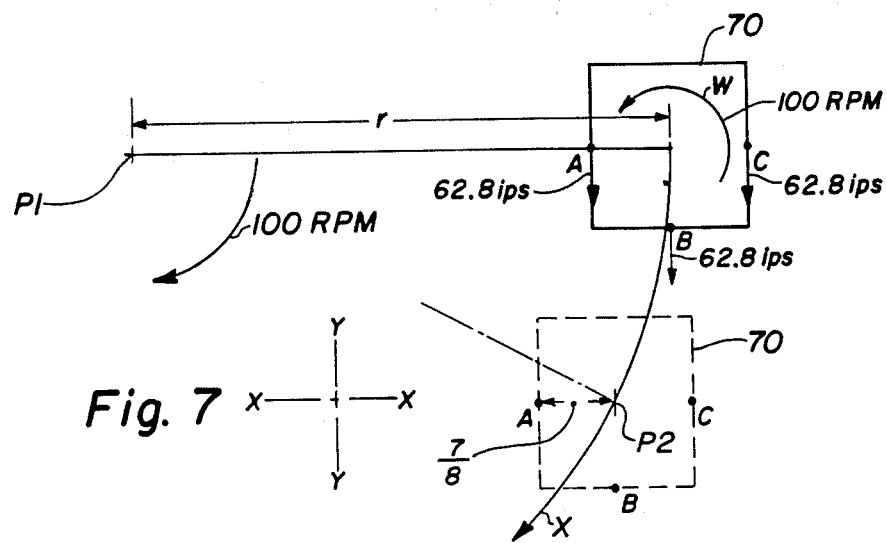
FIG. 7 illustrates principles of the present invention employed to overcome the problems illustrated in FIGS. 1–6.

In accordance with the present invention, FIG. 7 shows that the relationship of liquid impacting velocity with respect to distance from an axis of rotation can be advantageously modified from that described in relation to FIG. 2. In FIG. 7, there is illustrated a 1¾ inch square part layer 70 rotating or orbiting clockwise in the direction of arrow X around an axis of rotation perpendicular to the drawing sheet and intersecting point P1 at 100 rpm. In addition, the layer 70 is rotating or spinning counter-clockwise in the direction of arrow W around a layer axis of rotation also perpendicular to the drawing sheet and intersecting point P2 at 100 rpm. The distance or radius r between the points P1 and P2 is six inches. The instantaneous tangential velocities $V_t$ of the layer 70 at a point . A where the radius r first intersects the left perimeter of the layer 70, at a point B where a line perpendicular to the radius r through the layer rotational axis intersects the leading edge of the layer 70, and at a point C where the radius if extended would contact the right edge of the layer are calculated as follows:

$$V_{ty} \text{ at } A = (2)(\pi)(5.125)(100/60) +$$
$$(2)(\pi)(7/8)(100/60)$$
$$= 62.8 \text{ ips}$$
$$V_{ty} \text{ at } B = (2)(\pi)(6)(100/60)$$
$$= 62.8 \text{ ips}$$
$$V_{ty} \text{ at } C = (2)(\pi)(6.875)(100/60) -$$
$$(2)(\pi)(7/8)(100/60)$$
$$= 62.8 \text{ ips}$$

As you can see, the instantaneous velocities in the y direction can be made the same at different radial distances from an axis of rotation passing through point P1. This causes the liquid impacting force at all points on the layer 70 to be more uniform. Further, if the layer 70 rotates about point P2 while orbiting around a central axis passing through point P1, the orientation of an unhardened layer portion can be different each time the portion passes through a spray of one or more nozzle(s), thus, curing the problem illustrated in FIG. 3. This rotation of the rotor and counter rotation of the layer 70 enables vias to be formed with the rotational speed of the rotor much less than the typical rotational speed of parts on prior art developers. This permits the development of nonsymetrical parts.

Figure 8:
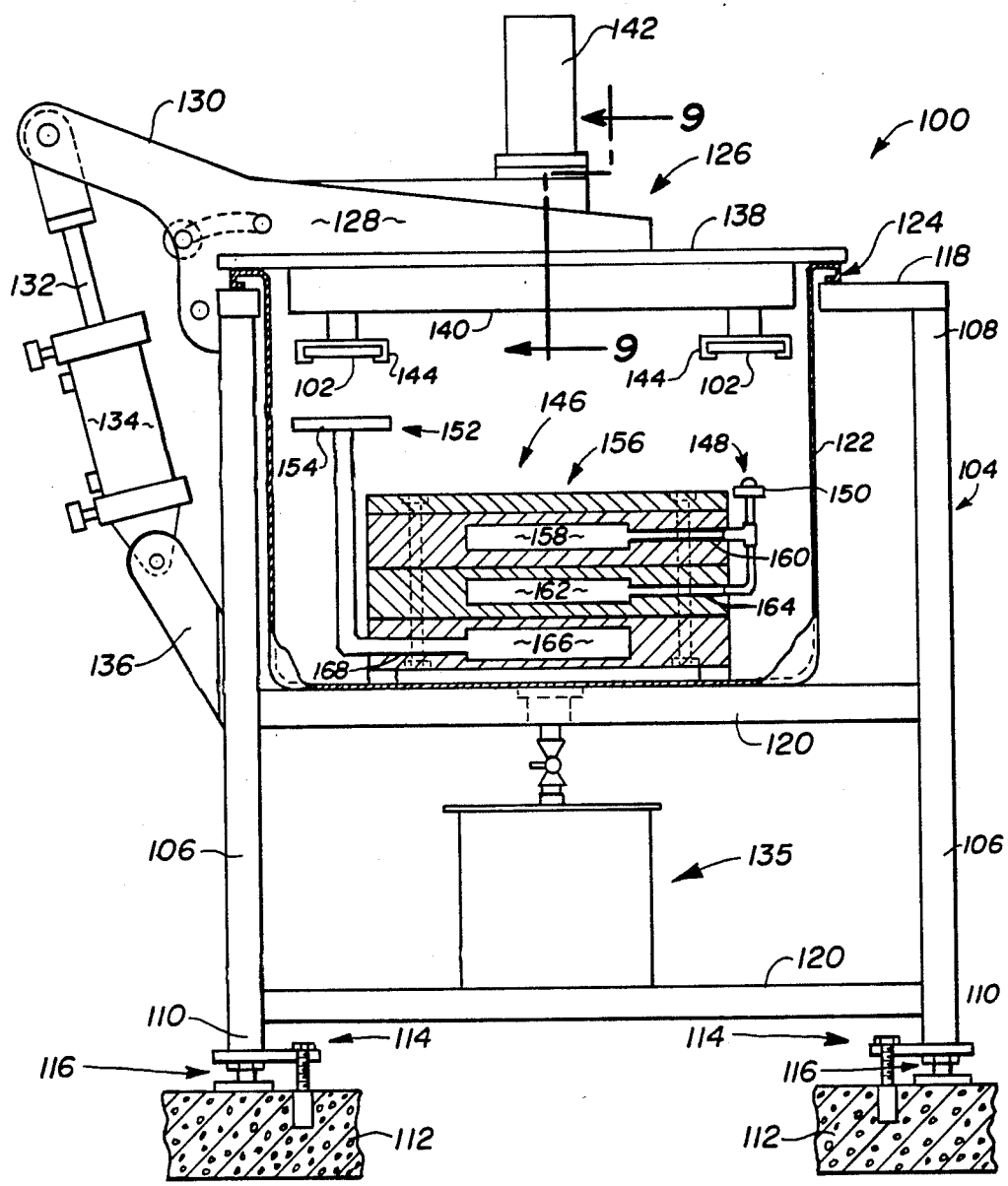
FIG. 8 is a schematic representation of a rotary developer in accordance with the present invention with some elements in section for clarification.

Referring to FIG. 8, there is illustrated a preferred embodiment of the present invention. There is shown a rotary developer 100 for removing portions of a plurality of layers 102 of electronic parts to form vias in the parts. The layers 102 comprise hardened and unhardened (hardenable) portions of a photopolymer.

The developer 100 includes a table like frame 104 having legs 106 with upper and lower ends, 108 and 110, respectively. The leg lower ends 110 can be fixed to the ground 112, such as, by bolt assemblies 114. The leg lower ends 110 can have levelers and shock absorbers 116 for contacting the ground. The leg upper ends 108 support a counter top 118. Support members 120 interconnect the legs 106 to provide rigidity and support surfaces.

A tank or container 122 having a circular opening defined by a lip 124 is supported by the counter top 118. The opening of the tank 122 is in a generally horizontal plane near the counter top 118. The tank 122 extends downward inside the frame 104 and can be additionally supported by one or more of the support members 120.

The frame 104 includes a lid or support 126 which is pivotably connected to the counter top 118 and/or one of the support members 120 by a hinge assembly 128.

The hinge assembly 128 has an arm 130 extending away from the tank 122. The arm 130 is connected to a rod 132 of a pnematic cylinder 134. The cylinder 134 is also connected by a bracket 136 to one of the support members 120. When air pressure draws the rod 132 inside the cylinder 134, the lid 126 travels to its second or open position. When the rod 132 extends from the cylinder 134, the lid 126 pivots to its first position closing and sealing the tank 122.

The lid 126 has a disk or disk portion 138 connected to the hinge assembly 128 that closes and seals the tank opening when the lid 126 is in the first position as illustrated in FIG. 8. A seal member can be positioned on the disk 138 and/or the tank lip 124 for sealing the tank 122 when it is in its closed position.

A rotor 140 is rotatably supported on the disk portion 138. The rotor 140 extends into the tank 122 when the lid 126 is in the first or closed position. The disk portion 138 supports an adjustable or variable speed motor 142 operatively connected to rotate or spin the rotor 140 in a first direction, e.g., clockwise looking up at the rotor 140 from inside the tank 122. The motor 142 can be on a side of the disk portion 138 opposite to the disk portion side from which the rotor 140 extends. Preferably the motor 142 is variable between speeds of approximately 20 to 200 rpm.

At least one part holder 144 is rotatably connected to the rotor 140 about a holder axis. The holders 144 are equally spaced around the rotor axis and at the same radial distance from the rotor axis. In one embodiment, the holder axes are six inches from the rotor axis. The holders 144 are designed and oriented to releasably hold electronic parts with layers 102 facing downward. The holders 144 grip the parts without significantly covering the layers 102. Means is or are provided to rotate the holders in a second direction, opposite to the first direction, e.g., in counter-clockwise directions with respect to the support 126 looking up at the holders from inside the tank.

Inside the tank 122, there is provided means 146 for spraying a liquid and a gas on the layers 102 to remove the unhardened portions which can be soluble in the liquid to form vias and to dry the layers 102 and vias. This means 146 comprises means for spraying 148 the liquid including one or more fan spray nozzle 150. The nozzle 150 can be chosen to provide an atomized mist of the liquid and the gas, or just a spray of the liquid. Each nozzle 150 is positioned substantially on a holder axis at one position of the rotor 140 (with the lid 126 in the closed position) directed along the respective holder axis toward the holder 144 and the layer 102 of the part held by the respective holder 144.

The ratio of layer rotation about its holder axis to layer rotation about the rotor axis should be such that the layer will present itself to each nozzle at an angle different from that presented to the previous nozzle. This eliminates the leading and trailing side effects explained in relation to FIG. 3.

The means 146 for spraying a liquid and a gas further comprises means for blowing 152 the gas to remove excess (or some of the) liquid and the washed out portions of the layers from the parts. The blowing means 152 comprises one or more air or gas knife 154 for blowing a planar pattern of dry gas, such as nitrogen or dry air, toward the layer(s) 102. Each air knife 154 is positioned on a holder axis at a position of the rotor 140, other than those positions filled by nozles 150, directed along the respective holder axis toward the part layer 102 held by the respective holder 144. The air knives 154 are spaced closer to the holders 144 than the nozzles 150.

The nozzles 150 and air knives 154 can be angled from lines perpendicular to the layers to produce forward, neutral and reverse impact velocities on the layers as they rotate.

A manifold assembly 156 is connectable to sources of the dry gas and the liquid. A first reservoir 158 is connected by a passage 160 to provide the liquid to the nozzle(s) 150. A second reservoir 162 is connected by a passage 164 to provide the dry gas to the nozzle(s) 150 for providing atomized mist, if desired. A third reservoir 166 is connected by a passage 168 to provide the dry gas to the air knives 154.

A spent liquid system 135 is connected to the bottom of the tank 122. Such a system can include a sump connected by a line without or with a valve for automatically and/or selectively draining spent liquid from the tank 122. The spent liquid can be drawn out of the tank 122 by a pump controlled by a float operated switch, for instance, located in the tank 122. A liquid recovery or recirculating system can be added to clean the spent liquid by passing it through one or more filters.

A gas vent can be connected to an opening in the tank 122 for venting the gas. An exhaust blower can periodically draw the gas through the vent, such as before pivoting the lid 126 to its open position, or continuously draw gas through the vent creating a pressure in the tank 122 slightly below atmospheric pressure.

Figure 9:
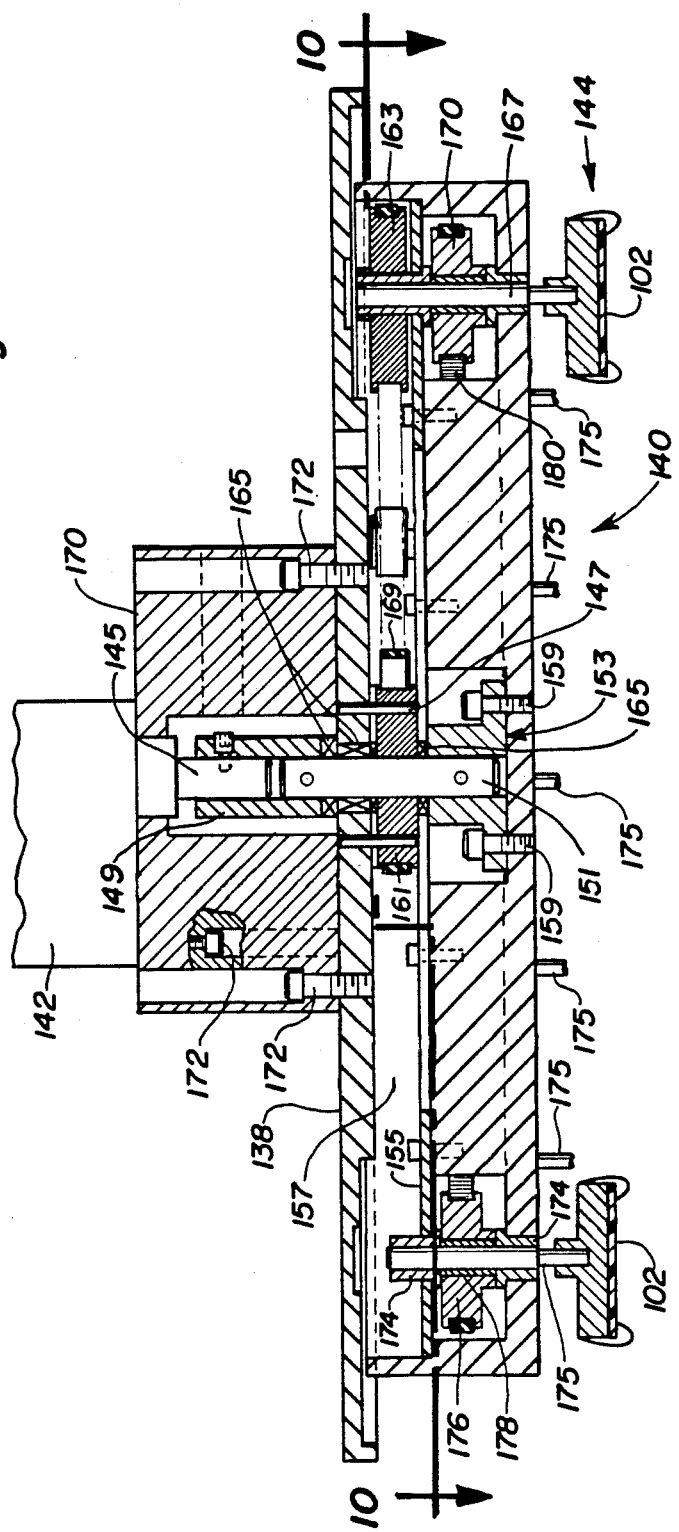
FIG. 9 is a sectional view of the rotor and support shown in FIG. 8, taken generally along line 9—9 in FIG. 8, looking in the direction of the arrows with features omitted for purposes of clarity.
Figure 10:
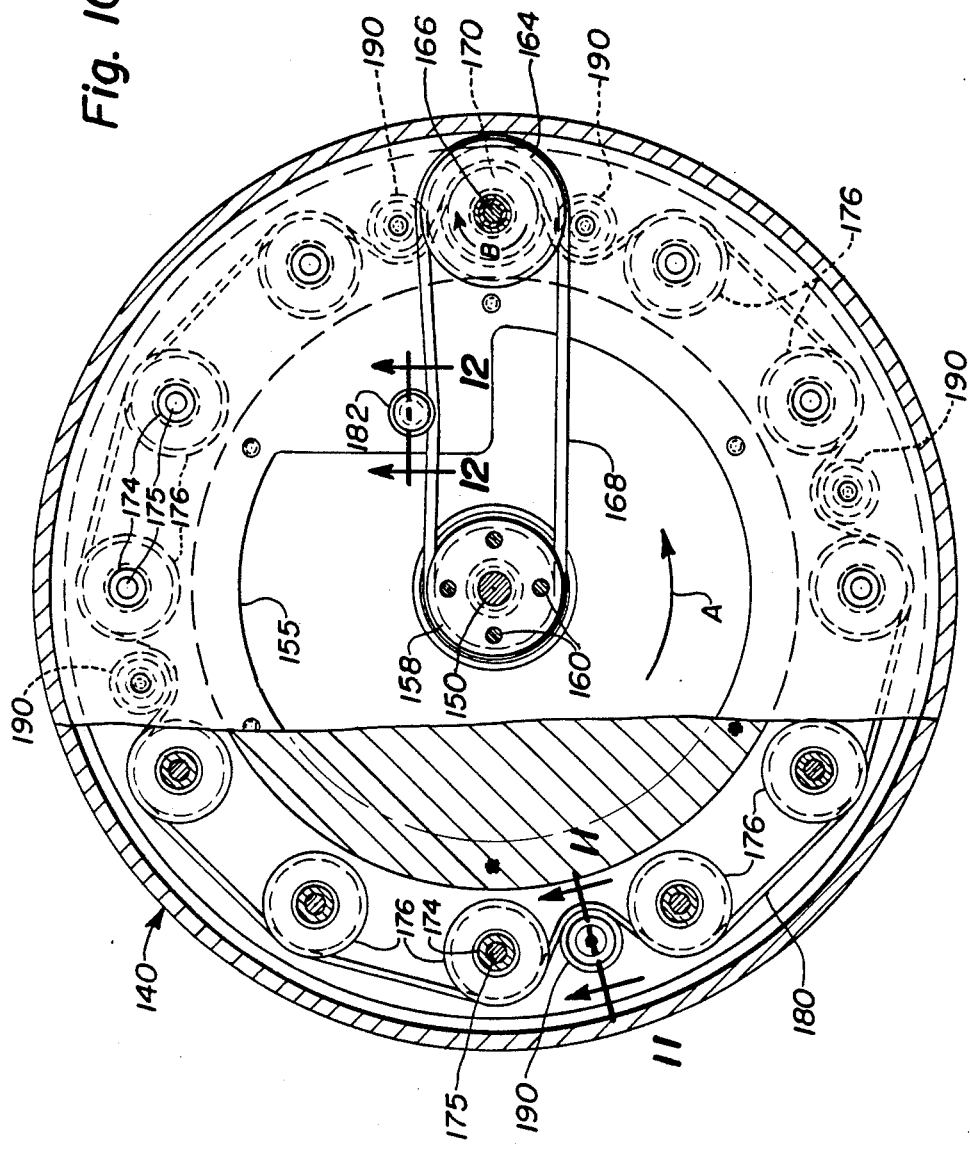
FIG. 10 is a sectional view of the rotor shown in FIG. 9, taken generally along line 10—10 in FIG. 9, looking in the direction of the arrows with features omitted for purposes of clarity.

FIG. 9 is a sectional view of the rotor 140 shown in FIG. 8, taken generally along line 9—9 in FIG. 8, looking in the direction of the arrows. FIG. 10 is a sectional view taken generally along line 10—10 in FIG. 9, looking in the direction of the arrows. These figures show the means for rotating the rotor 140 about the rotor axis in a first direction with respect to the support and for rotating the holders 144 about the holder axes in other directions with respect to the rotor 140.

FIG. 9 shows the motor 142 connected to the disk 138 by an intermediate assembly 170 including bolts 172. The motor 142 has an axle 145 which is rotated by the motor 142. The rotor 140 is connected to the motor axle 145 by a coupling assembly so that the axle 145 intersects the rotor axis and the rotor 140 rotates with the axle 145. Specifically, the coupling assembly includes a sleeve 149 around ends of the axle 145 and a shaft 151 aligned with the axle 145. The other end of the shaft 151 is fixed to a coupler 153 which is connected by bolts 159 to the rotor 140.

A space 157 is defined between the disk 138 and the rotor 140.

A stationary pulley 161 is located in the space 157 connected to the disk 138 by pins or screws 147. The stationary pulley 161 is ring shaped having a center hole and an outer circumferential surface. The axle 145 passes through the center hole. Bearings 165 can be located above and below the stationary pulley 161 around the shaft 145.

A rotatable pulley 163 having an outer circumferential surface is in the space 157 fixed to one of the holders 144 by a shaft 167 such that when the rotatable pulley 163 spins, the attached holder 144 spins. A timing rope or belt 169 with or without teeth matched to grooves in the pulleys goes around and contacts the circumferential surfaces of the stationary and rotatable pulleys such that when the motor 142 is turned on, the motor 142 rotates the axle 145 for instance in the direction of arrow A in FIG. 10. This rotates the rotor 140 in the same direction with respect to a fixed point. The timing belt 169 controls the rotation of the rotatable pulley 163 and its attached holder 144. With respect to the rotor 140, the speed and direction of rotation of the rotatable pulley 163 is controlled by the selection of circumferences for the stationary and rotatable pulleys. The speed of the rotatable pulley 163 is increased by making the circumference of the rotatable pulley 163 smaller than the circumference of the stationary pulley 161. The pulley circumferences are chosen such that when the rotatable pulley 163 has rotated entirely around the rotor axis back to its starting position the rotatable pulley 163 has rotated 360° plus or minus 40° (and preferably plus or minus 18° ) about its holder axis from its starting position. In other words, the rotational speed of the rotatable pulley 163 about its holder axis is substantially the same, but preferably different, than the rotational speed of the rotor 140 about the rotor axis.

If more than one holder 144 is provided, around the shaft 167 connecting the rotatable pulley 163 and the first holder 144, between the rotatable pulley 163 and the first holder 144, there is connected a holder pulley 170 that rotates with the rotatable pulley 163. The holder pulley 170 has an outer circumferential surface. At least one additional holder 144 is rotatably connected to the rotor 140 equidistantly spaced from the rotor axis as the first holder 144. These additional holders 144 are connected to a rotatable shaft 175 passing through the rotor 140. The shafts 175 rotate inside sleeve bearings 174. A holder pulley 176 having an outer circumferential surface is attached around each holder shaft 175. Each holder pulley 176 is identical to the holder pulley 170. Sleeves 178 can be fixed to and located between the holder pulleys 176 and the holder shafts 175. A driving rope or belt 180, for instance, like the timing belt 169, goes around and contacts the outer circumferential surfaces of all the holder pulleys 176 such that when the first holder pulley 170 turns counterclockwise in FIG. 9 due to the movement of the timing belt 169, all the other holder pulleys 176 turn counterclockwise due to the driving belt 180.

The rotor 140 comprises a disk shaped member having a central indent for receiving the coupler 153. The rotor 140 further has an annular space near a periphery of the rotor. The rotor includes a plate 155 generally enclosing the annular space. The holder pulleys 170 and 176 are located in the annular space. The holder shafts 166 and 175 are supported at one end by the plate 155 and by another wall of the annular space.

All the pulleys can be replaced with gears nnd the belts replaced with chains. Alternatively, the holder shaft(s) 167 and/or 175 can be made the axes of planetary gears of a planetary gear drive. A separate motor could rotate the first holder shaft replacing the stationary pulley, the rotatable pulley and the timing belt. Alternatively, separate motors could rotate each of the holder shafts replacing all the pulleys and belts.

Figure 11:
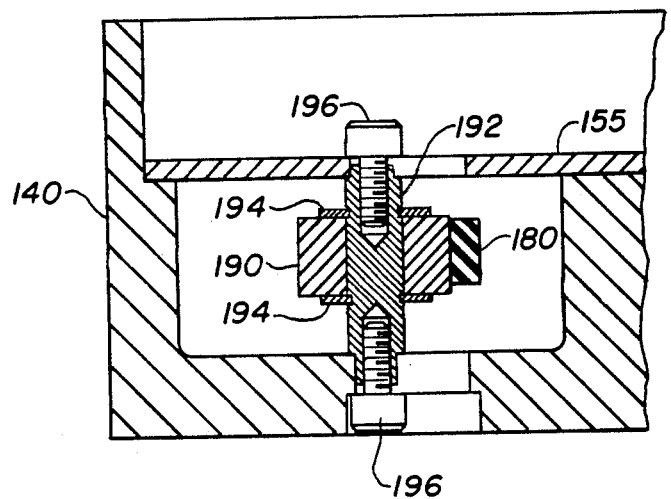
FIG. 11 depicts a sectional view of the driving belt biasing wheel taken generally along line 11—11 in FIG. 10, looking in the direction of the arrows.

Referring to FIG. 11, driving belt biasing wheels 190 are rotatably mounted on the rotor 140 by shafts 192 to increase tension of the driving belt 180. Stops 194 are provided on both sides of the driving belt biasing wheels 190 to prevent movement of the wheels 190 along the axis of the shafts 192. Enlarged heads 196 are on the shaft ends and interact with the rotor 140 to hold and position the driving belt biasing wheels 190.

Figure 12:
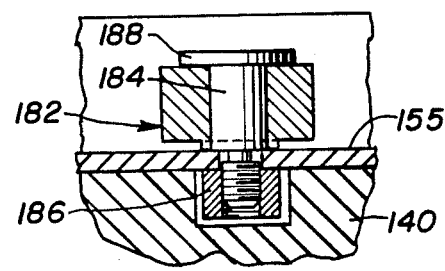
FIG. 12 depicts a sectional view of the timing belt biasing wheel taken generally along line 12—12 in FIG. 10, looking in the direction of the arrows.

Referring to FIG. 12, a timing belt biasing wheel 182 is rotatably mounted on the rotor 140 by a shaft 184. The wheel shaft 184 has an enlarged head 186 on one end of the shaft 184 and a stop 188 on the other end. The stop 188 prevents movement of the wheel 182 in one direction. The shaft 184 extends through a hole in the plate 155 with the wheel 182 on one side of the plate 155 and the head 186 on the other side of the plate 155. The head 186 abuts against the plate 155 keeping the wheel 182 connected to the rotor 140. The timing belt biasing wheel 182 enables one to increase the tension of the timing belt 169.

Figure 13:
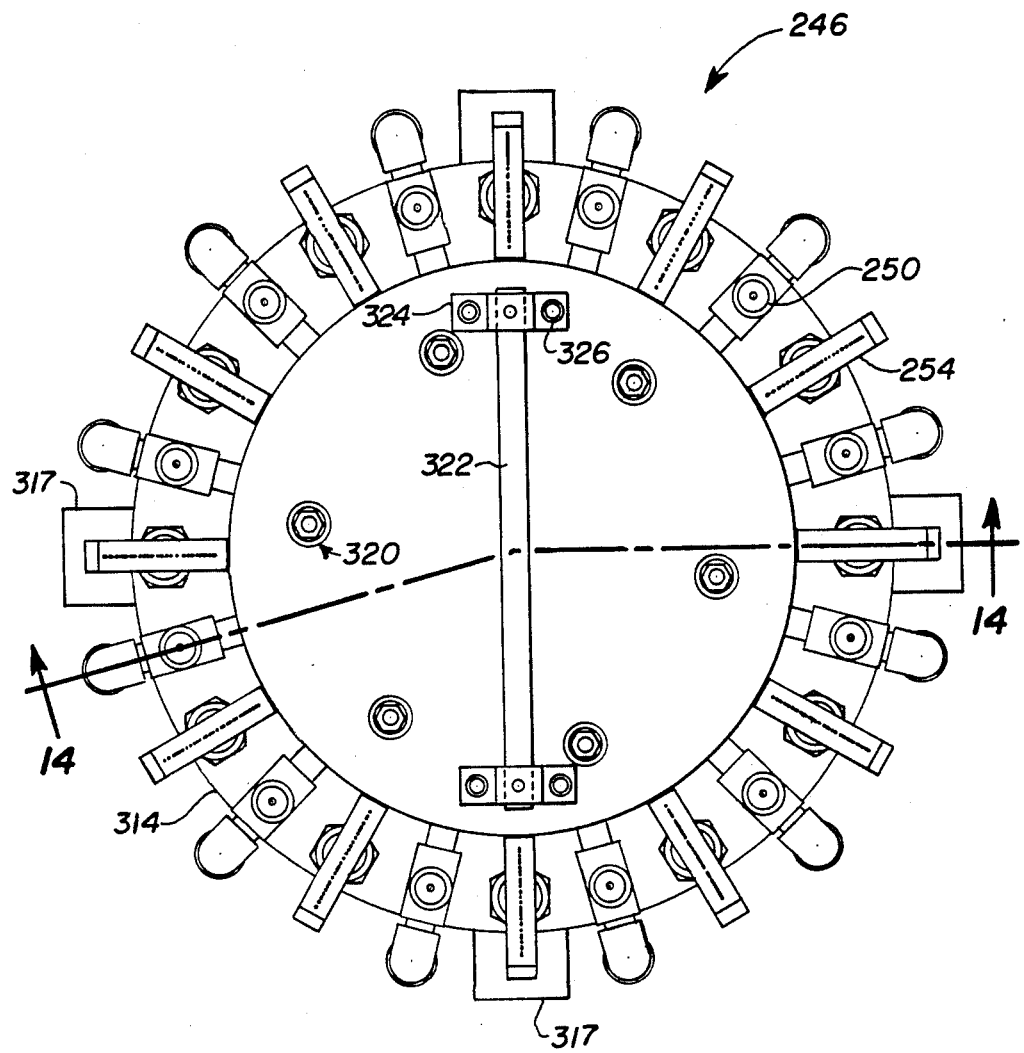
FIG. 13 is a top view of a means for spraying a liquid and a gas on a layer to form vias and to dry the layer and vias.

FIG. 13 shows a top view of a preferred embodiment for means 246 for spraying a liquid and a gas on the layers 102 to remove the soluble photopolymer portions to form vias and to dry the layers 102 and vias. Here, the means for spraying 248 the liquid comprises twelve fan spray nozzles 250 equally spaced from one another in a circle around, with equal radius from, the rotor axis. The rotor 140 can be turned such that each of the nozzles 150 is on a holder axis directed toward a respective holder 144. Thus, in a preferred embodiment, there are twelve holders 144 on the rotor 140. The means for blowing 252 the gas comprises twelve gas knives 254 equally spaced from one another and generally located at the same radius from the rotor axis.

In another preferred embodiment, there are twelve holders, but only six nozzles and six air knives.

The nozzles 250 and gas knives 254 are oriented such that the liquid or gas spray generated by each occurs in a planar pattern, the plane of spray from each nozzle 250 and knife 254 generally intersecting the respective nozzle 250 or knife 254 and the rotor axis.

Figure 14:
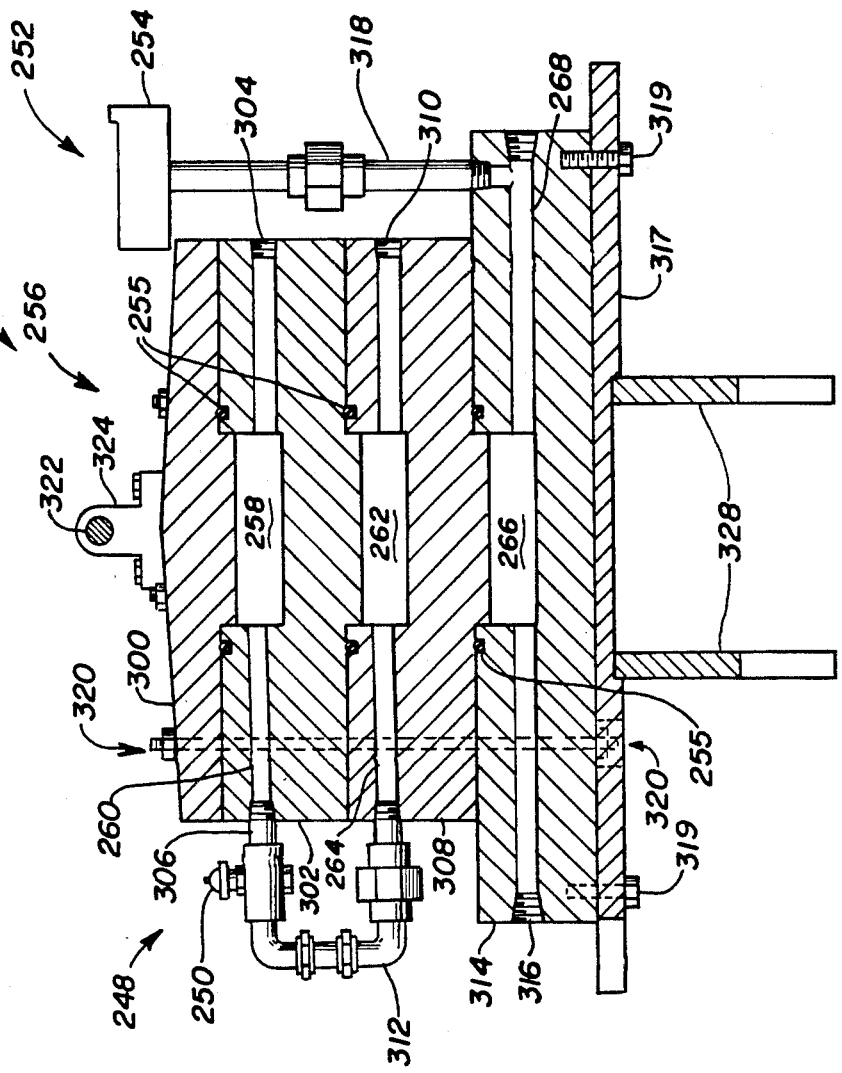
FIG. 14 is a sectional view of the spraying means shown in FIG. 13, taken generally along line 14—14 in FIG. 13, looking in the direction of the arrows.

FIG. 14 shows a sectional side view of this means for spraying 246 the liquid and the gas generally along line 14—14 in FIG. 13, in the direction of the arrows. The manifold assembly 256 comprises a first disk plate 300 on a second disk plate 302. A bottom surface of the first plate 300 and a top surface of the second plate 302 define the first reservoir 258. An inlet passage 304 extends through the second plate 302 to the first reservoir 258 to supply the liquid to the first reservoir 258. An outlet passage 260 extends radially from the first reservoir 258 through the second plate 302 for supplying liquid to each of the nozzles 250. Pipe, line or other means 306 couple the outlet passages 260 to the nozzles 250.

The second plate 302 is on a third disk plate 308. A bottom surface of the second plate 302 and a top surface of the third plate 308 define the second reservoir 262. An inlet passage 310 extends through the third plate 308 to the second reservoir 262 to supply dry gas to the second reservoir 262, if desired. An outlet passage 264 extends radially from the second reservoir 262 through the third plate 302 for supplying the dry gas to each of the nozzles 250 to form an atomized mist. Pipe, line or other means 312 couple the gas outlet passages 264 to the nozzles 250.

The third plate 308 is on a fourth disk plate 314 havinq a greater circumference than the other plates. A bottom surface of the third plate 308 and a top surface of the fourth plate 314 define the third reservoir 266. An inlet passage 316 extends through the fourth plate 314 to the third reservoir 266 to supply dry gas to the third reservoir 266. An outlet passage 268 extends radially from the third reservoir 266 through the fourth plate 314 for supplying the gas to each of the gas knives 254. Pipe line or other means 318 couple these gas outlet passages 268 to the gas knives 254.

A bottom of the fourth plate 314 is connected to a guide plate 317 by screws 319. The disk plates are connected by nut and bolt assemblies 320. A lift bar 322 can be connected to a top of the first plate 300 by brackets 324 and screws 326. A cylindrical spacer 328 extends between the guide plate 317 and the tank 122.

Seals or O-rings 255 can be located between each of the plates.

In operation, the support 126 starts its cycle in its second or open position. Parts are loaded onto the holders 144 with the layers 102 facing away from the rotor 140. Then the support 126 is pivoted to its first position closing the tank 122. The motor 142 is turned on spinning the rotor 140 about its axis in a clockwise direction looking toward the rotor 140 from inside the tank 122. The spinning movement of the rotor 140 causes the holders to orbit about the rotor axis. The spinning movement of the rotor 140 causes the timing and driving belts 168 and 180, respectively, to rotate the holders 144 about their holder axes in a counter-clockwise direction looking toward the rotor 140 from inside the tank 122. While the rotor 140 is spinning, liquid is sprayed on the layers 102 from the nozzles 150 in the tank 122. Unhardened portions of the layers 102 are removed or washed away by the liquid to form vias. While the nozzles 150 are spraying the liquid, the gas knives 154 blow the dry gas to remove excess liquid and to blow away the washed out unhardened Portions. The liquid spray is stopped and then the gas knives 154 may continue to blow dry gas toward the layers 102 while the rotor 140 is spinning to dry the layers 102. After the gas knives 154 stop blowing, the support or cover 126 is pivoted to its open position. Then the parts are removed and the cycle repeated, if desired.

Figure 15:
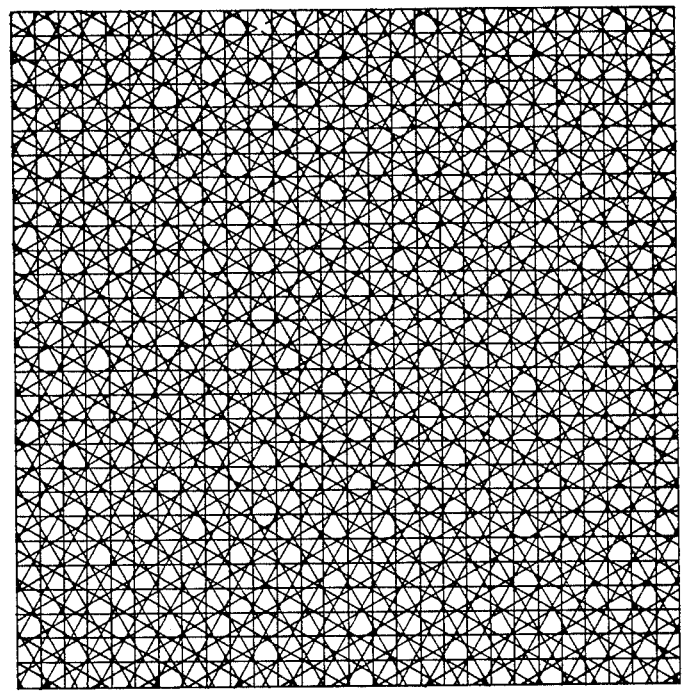
FIG. 15 shows the pattern of a layer impacted by spray from a simplified fan spray nozzle, like that used in FIG. 2, spraying discrete lines of liquid toward a layer rotated past six nozzles generally in accordance with the present invention.
Figure 16:
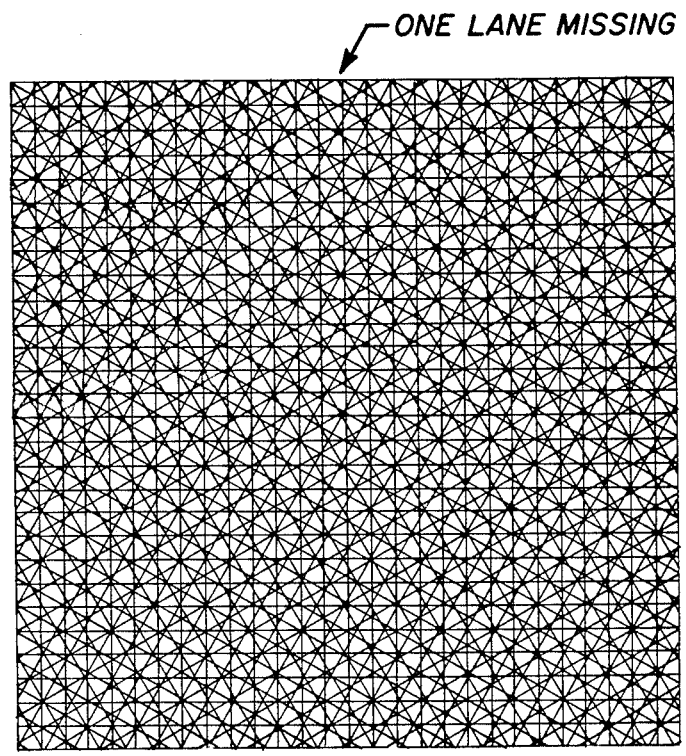
FIG. 16 illustrates the pattern of a layer impacted by spray as in FIG. 15 with one line of one of the nozzles not operational resulting in one missing lane.

FIGS. 15 and 16 relate to the simplified illustration shown in FIGS. 4–6. FIG. 15 shows the pattern of developed lanes on a layer that is held by a simplified rotary developer of the present invention passing over six nozzles with the simplified line spray illustrated in FIG. 4. For simplicity, the lanes are drawn straight rather than curved. FIG. 16 shows the lane pattern depicted in FIG. 15 with one of the lines of one of the six nozzles inoperative. The arrow is pointing to the resulting missing lane. FIGS. 15 and 16 show that the surface area of a layer is developed by the present invention much more evenly than with prior art developers.

Those skilled in the art, having the benefit of the teachings of the present invention as hereinabove set forth, can effect numerous modifications thereto. These modifications are to be construed as being encompassed within the scope of the present invention as set forth in the appended claims.

I claim:

1. A rotary developer for removing a portion of a layer of an electronic part to form a via in the part, the developer comprising:
   a support;
   a rotor having a rotor axis, the rotor rotatably connected to the support about the rotor
   a part holder having a holder axis, the holder rotatably connected to the rotor about the holder axis;
   means for rotating the rotor about the rotor axis in a first direction and for rotating the holder about the holder axis in a second direction; .
   means for spraying a liquid and a gas on the layer to remove the portion to form the via and to dry the layer and the via.

2. The rotary developer as in claim 1, wherein the holder axis is spaced from, and substantially parallel to, the rotor axis.

3. The rotary developer as in claim 1, wherein the first direction is opposite to the second direction.

4. The rotary developer as in claim 1, wherein the rotating means is for rotating the holder with respect to the support.

5. The rotary developer as in claim 1, wherein the rotating means comprises:
   an adjustable motor connected to the support, the motor having an axle rotatable about an axle axis;
   means for connecting the axle to the rotor with the axle axis intersecting the rotor axis;
   a stationary pulley around the axle and fixed to the support, the stationary pulley having a circumferential surface;
   a rotatable pulley fixed to the holder and rotatable about the holder axis, the holder pulley having a circumferential surface; and
   timing means for going around and contacting the stationary pulley circumferential surface and the holder pulley circumferential surface,
   whereby when the motor is turned on, the motor rotates the axle in one direction rotating the rotor in the first direction and the timing means rotates the holder in the second direction.

6. The rotary developer as in claim 5, wherein the circumferences of the stationary pulley circumferential surface and the rotatable pulley circumferential surface are different.

7. The rotary developer as in claim 1, wherein there are a plurality of part holders, the holders having holder axes and rotatably connected to the rotor about the holder axes;
   the rotating means is for rotating the holders in the second direction;
   the spraying and drying means comprises means for spraying the liquid on layers of parts to wash away unexposed photopolymer portions of the layers to form vias when the parts are held by the holders and the rotor and holders are rotating; and
   the spraying and drying means further comprises means for blowing the gas to remove some of the liquid and the portions from the layers and then to dry the layers and vias when the parts are held by the holders and the rotor and holders are rotating.

8. The rotary developer as in claim 7, wherein the rotating means comprises:
   an adjustable motor connected to the support, the motor having an axle rotatable about an axle axis;
   means for connecting the axle to the rotor with the axle axis intersecting the rotor axis;
   a stationary pulley around the axle and fixed to the support, the stationary pulley having a circumferential surface;
   a rotatable pulley fixed to one of the holders and rotatable about the one holder axis, the one rotatable pulley having a circumferential surface;
   timing means for going around and contacting the stationary pulley circumferential surface and the one rotatable holder pulley circumferential surface;
   a holder pulley fixed to each of the holders, the holder pulleys having circumferential surfaces; and
   driving means for going around and contacting each of the holder pulley circumferential surfaces,
   whereby when the motor is turned on, the motor rotates the motor axle in the first direction rotating the rotor in the first direction, the timing means rotates the rotatable pulley in the second direction, and the driving means rotates the holders in the second direction.

9. The rotary developer as in claim 7, wherein there is a total of twelve holders.

10. The rotary developer as in claim 1, wherein the spraying and drying means comprises:
    means for spraying the liquid comprising a fan spray nozzle fixed in a position spaced from and directed toward the layer when the part is held by the holder, the nozzle substantially on the holder axis at a first position of the holder.

11. The rotary developer as in claim 1, wherein the spraying and drying means comprises:
    means for spraying comprising a stationary fan spray nozzle capable of spraying the liquid in a fanning out fashion substantially in a plane substantially intersecting the rotor axis and the holder axis at a first position of the holder, such that when the rotor rotates the holder past the nozzle while the holder is holding the part and the nozzle is spraying, substantially all of the layer is sprayed.

12. The rotary developer as in claim 11, wherein the plane is at an acute angle with a plane intersecting the rotor axis and the holder axis at the first position of the holder 13. The rotary developer as in claim 11, wherein the plane intersects the rotor axis and the holder axis at the first position of the holder.

14. The rotary developer as in claim 1, wherein the spraying and drying means comprises:
    means for spraying comprising an atomizing fan spray nozzle capable of spraying a mixture of the liquid and the gas toward the layer when the part is held by the holder and the holder is at a first position.

15. The rotary developer as in claim 1, wherein the spraying and drying means comprises:
    means for spraying the liquid comprising a plurality of fan spray nozzles, each of the nozzles fixed in a position substantially on a circle spaced from and directed toward the layer when the part is held by the holder, the nozzles substantially on the holder axis at different positions of the holder.

16. The rotary developer as in claim 15, wherein there are a total of six nozzles spaced around the circle with about 60° between adjacent ones of the nozzles.

17. The rotary developer as in claim 1, wherein the spraying and drying means comprises:
    means for blowing the gas to remove some of the liquid and the portion from the layer and then to dry the layer, the blowing means comprising a gas knife fixed in a position spaced from, and for blowing the gas toward, the layer when the part is held by the holder, the gas knife substantially on the holder axis at a second position of the holder.

18. The rotary developer as in claim 1, wherein the spaying and drying means comprises:
    means for blowing the gas to remove some of the portion from the layer and then to dry the layer, the blowing means comprising a stationary gas knife capable of blowing dry gas in a knife edge pattern substantially in a plane substantially intersecting the rotor axis and the holder axis at a second position of the holder, such that when the holder rotates the holder past the gas knife while the holder is holding the part and the knife is blowing, all of the layer is blown by the gas.

19. The rotary developer as in claim 1, wherein the spraying and drying means comprises:
    means for blowing the gas to remove some of the liquid and the portion from the layer and then to dry the layer, the blowing means comprising a plurality of gas knives, each of the knives fixed in a position substantially on a second circle spaced from and directed toward the layer when the part is held by the holder, the knives substantially on the holder axis at different positions of the holder.

20. The rotary developer as in claim 19, wherein there are a total of six gas knives spaced around the second circle with about 60° between adjacent ones of the nozzles.

21. The rotary developer as in claim 16, wherein the spraying and drying means comprises:
   means for blowing the gas to remove some of the liquid and the portion from the layer and then to dry the layer, the blowing means comprising six gas knives, each of the knives fixed in a position substantially on a second circle spaced from and directed toward the layer when the part is held by the holder, the knives substantially on the holder axis at different positions of the holder; and wherein
   one of the knives is between adjacent ones of the nozzles.

22. The rotary developer as in claim 1, further comprising:
   a frame;
   a tank having an opening, the tank supported by the frame, the spraying and drying means in the tank;
   the support pivotably connected to the frame between first and second positions, such that in the first position the support closes the tank opening with the rotor and the holder extending into the tank and in the second position the support is angled away from the tank providing access to the holder for replacement of electronic parts; and
   means for Pivoting the support between the first and second positions.

23. The rotary developer as in claim 1, wherein:
   the layer comprises hardened and hardenable portions and the liquid and the gas remove the hardenable portions.

24. The rotary developer as in claim 23, wherein:
   the layer comprises a photopolymer.

25. The rotary developer as in claim 23, wherein:
   the portions are soluble in the liquid.

26. The rotary developer as in claim 24, wherein:
   the portions are soluble in the liquid.

27. A method for developing a portion of a layer comprising hardened and unhardened portions of an electronic part to form a via in the layer comprising the steps of:
   loading the electronic part on a part holder rotatably mounted on a rotor;
   spinning the rotor about an axis in a first direction;
   orbiting the holder about the rotor axis;
   rotating the holder about a holder axis;
   spraying a liquid on the layer to wash out the unhardened portion to form a via;
   drying the layer and the via; and
   removing the part.

28. The method of claim 27, wherein the spinning, orbiting, rotating and spraying steps occur simultaneously.

29. The method of claim 28, wherein:
   during the rotating step, the holder rotates about the holder axis in a second direction opposite to the first direction.

30. The method of claim 29, wherein:
   the holder rotates at substantially the same speed as the rotor.

31. The method of claim 29, wherein:
   the holder rotates at a different speed than the rotor.

32. The method of claim 27, further comprising the steps of:
   after the loading step, closing a tank with a cover supporting the rotor and holder inside the tank; and
   after the drying step, opening the tank by moving the cover.

33. The method of claim 27, wherein there are a plurality of part holders, a plurality of electronic parts having layers with unhardened portions are loaded on the holders, the holders are orbited about the rotor axis while the holders rotate about holder axes, the liquid is sprayed on the layers to form vias, the layers and vias are dried, and the parts are removed.

34. The method of claim 27, wherein:
   the layer comprises a photopolymer.

35. The method of claim 27, wherein:
   the unhardened portion is soluble in the liquid.

36. The method of claim 27, further comprising the step of:
   blowing a gas on the layer to remove excess liquid and to blow away the washed out unhardened portion while the liquid is being sprayed.

* * * * *